US012571958B2

(12) United States Patent
Demkov et al.

(10) Patent No.: US 12,571,958 B2
(45) Date of Patent: Mar. 10, 2026

(54) INTEGRATED OXIDE DEVICE

(71) Applicant: Board of Regents, The University of Texas System, Austin, TX (US)

(72) Inventors: Alexander A. Demkov, Austin, TX (US); John Elliott Ortmann, Jr., Austin, TX (US); Agham Posadas, Round Rock, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 883 days.

(21) Appl. No.: 17/733,777

(22) Filed: Apr. 29, 2022

(65) Prior Publication Data

US 2022/0268996 A1 Aug. 25, 2022

Related U.S. Application Data

(63) Continuation-in-part of application No. PCT/US2020/057937, filed on Oct. 29, 2020.

(Continued)

(51) Int. Cl.
*G02B 6/12* (2006.01)
*C23C 14/08* (2006.01)
(Continued)

(52) U.S. Cl.
CPC ........ *G02B 6/12002* (2013.01); *C23C 14/082* (2013.01); *C23C 14/083* (2013.01);
(Continued)

(58) Field of Classification Search
CPC ................................ G02B 6/131; C30B 29/32
See application file for complete search history.

(56) References Cited

U.S. PATENT DOCUMENTS

2002/0061631 A1   5/2002   Miyabayashi et al.
2003/0015770 A1*  1/2003   Talin ...................... G02B 6/132
                                                                        257/622

(Continued)

FOREIGN PATENT DOCUMENTS

JP      11-176828 A      7/1999
WO   2020/180940 A1   9/2020

OTHER PUBLICATIONS

International Application No. PCT/US2020/057937, International Search Report, Written Opinion, 12 pages, Feb. 3, 2021.

(Continued)

*Primary Examiner* — Chad H Smith

(57) ABSTRACT

Various embodiments provide for systems and techniques for the successful fabrication of metal oxide (TMO)-on-glass layer stacks via direct deposition. The resulting samples feature epitaxial, strontium titanate (STO) or barium titanate (BTO) films on silicon dioxide ($SiO_2$) layers, forming STO- or BTO-buffered $SiO_2$ pseudo-substrates. As the integration of TMO films on silicon rely on an STO or BTO buffer layer, a wide variety of TMO-based integrated devices (e.g., circuits, waveguides, etc.) can be fabricated from the TMO-on-glass platform of the present technology. Moreover, the STO, or the BTO, survives the fabrication process without a corresponding degradation of crystalline quality, as evidenced by various objective measures.

19 Claims, 16 Drawing Sheets
(7 of 16 Drawing Sheet(s) Filed in Color)

Related U.S. Application Data

(60) Provisional application No. 62/927,546, filed on Oct. 29, 2019.

(51) Int. Cl.
| | |
|---|---|
| *C23C 14/34* | (2006.01) |
| *C30B 23/02* | (2006.01) |
| *C30B 29/32* | (2006.01) |
| *G02B 6/13* | (2006.01) |

(52) U.S. Cl.
CPC ............ *C23C 14/34* (2013.01); *C30B 23/025* (2013.01); *C30B 29/32* (2013.01); *G02B 6/131* (2013.01); *G02B 2006/12038* (2013.01); *G02B 2006/12047* (2013.01); *G02B 2006/12061* (2013.01)

(56) References Cited

U.S. PATENT DOCUMENTS

| | | | |
|---|---|---|---|
| 2018/0226247 A1 | 8/2018 | Chahal et al. | |
| 2019/0293971 A1 | 9/2019 | Yu et al. | |
| 2022/0244583 A1* | 8/2022 | Liang | G02F 1/05 |

OTHER PUBLICATIONS

Ortmann, Jr., John Elliott, Ph.D. Dissertation for "Optical And Electro-Optical Phenomena In Transition Metal Oxide Thin Film Heterostructures," 28 pages, May 2019.

Xiong, Chi et al., "Active Silicon Integrated Nanophotonics: Ferroelectric BaTiO3 Devices," Nano Letters, pp. 1419-1425, 2014.

* cited by examiner

200

400

1

INTEGRATED OXIDE DEVICE

CROSS-REFERENCE TO RELATED APPLICATIONS

The application is a continuation-in-part of International Patent Application No. PCT/US2020/057937 filed on Oct. 29, 2020; which claims priority to U.S. Provisional Patent Application No. 62/927,546 filed on Oct. 29, 2019, each of which is incorporated by reference herein in its entirety.

STATEMENT REGARDING FEDERALLY SPONSORED RESEARCH

This invention was made with government support under Grant No. FA9550-12-1-0494 awarded by the Air Force Office of Scientific Research. The government has certain rights in the invention.

TECHNICAL FIELD

Various embodiments of the present technology generally relate to fabrication of transition metal oxide (TMO)-on-glass layer stacks via direct deposition. More specifically some embodiments relate to the fabrication of epitaxial, strontium titanate (strontium titanate, STO) or (barium titanate, BTO) on silicon dioxide ($SiO_2$) without the need for complicated wafer-bonding processes.

BACKGROUND

The development of a process allowing for epitaxial deposition of TMO thin films on silicon (Si) was a monumental achievement in the field of integrated devices. By combining crystalline TMO thin films with silicon, the huge variety of emergent phenomena displayed by TMO thin films and thin film heterostructures suddenly became available on a technologically relevant platform. Many studies have since examined heterostructures of epitaxial TMO thin films on silicon for device fabrication, including planar electronic devices, microelectromechanical systems (MEMS), and photonic integrated circuits.

While the silicon compatibility of TMO thin films is critical for the fabrication of practical devices, many TMO-on-silicon devices would benefit greatly from integration on highly insulating $SiO_2$ instead, due to its superior electrical and optical isolation relative to semiconducting silicon. In fact, state-of-the-art TMO-based photonic devices are already being fabricated on $SiO_2$ rather than directly on silicon. Unfortunately, the amorphous nature of $SiO_2$ makes the direct epitaxial deposition of crystalline TMO thin films on $SiO_2$ impossible, necessitating the development of complicated wafer-bonding processes for the realization of the desired layer stacks. Such wafer-bonding processes are significantly more difficult to execute than direct epitaxial deposition and are not feasible in many laboratories, limiting the number of research groups who have access to such heterostructures. The development of a reliable, simple fabrication route would be highly useful in promoting novel technologies based on the TMO-on-glass platform.

SUMMARY

Various embodiments of the present technology provide for a process for the fabrication of epitaxial, crystalline TMO thin films on $SiO_2$ via direct deposition. Through X-ray spectroscopy and diffraction measurements as well as electron microscopy characterization, the successful fabrication of epitaxial STO on thick $SiO_2$ has been demonstrated. Because the fabrication of many promising TMO-based devices, such as those utilizing barium titanate ($BaTiO_3$, or BTO), EuO, and $STO/LaAlO_3$ superlattices, rely on a thin STO buffer layer for integration with silicon, various embodiments of the present technology will facilitate the creation of a wide range of novel integrated devices on the STO-buffered $SiO_2$ platform. No evidence of STO degradation is found as a result of the TMO-on-glass fabrication process.

Moreover, the tools needed for the successful completion of the process are available in most laboratories and clean rooms, allowing greater access to the state-of-the-art TMO-on-glass layer stacks already finding use in practical integrated technologies.

In some embodiments a wafer can be created that includes a silicon substrate, an $SiO_2$ layer formed on the silicon substrate, and a crystalline functional TMO layer created directly on the $SiO_2$ layer without wafer bonding. The functional TMO layer can be epitaxially grown via a direct deposition process (e.g., physical vapor deposition, chemical vapor deposition, atomic layer deposition, e-beam evaporation, e-beam sputtering, molecular beam epitaxy (MBE), or the like) in a pattern that includes a channel.

In some embodiments, the functional TMO can be grown or deposited using radio frequency (RF) sputtering. As compared to MBE, for example, and for either STO or BTO embodiments of the present technology, this provides a faster, more stoichiometric technique for the methods and systems disclosed herein that may be less complex to set up and operate, and easier and less labor intensive to control, monitor and automate. As such, embodiments of the present technology utilizing RF sputtering may enable end products of the disclosed processes that include either BTO or STO to be fabricated more cheaply (e.g., 20 times cheaper than MBE). The advantages of RF sputtering as compared to MBE for use in the present technology may arise from lower energy usage for the process, as by requiring less intensive vacuum, pressure and temperature conditions. For example, the use of RF sputtering alleviates the need for evaporation of titanium at −1700° C. in the methods according to the present technology. Furthermore, RF sputtering more readily enables crystalline TMO orientations to be specified— e.g., ferroelectric polarization in or out of plane on the glass ($SiO_2$).

For example, in some embodiments, the functional TMO layer can include $SrTiO_3$ and a layer of BTO can be formed within the channel to create a monolithic waveguide. The thick $SiO_2$ layer can provide electrical and optical isolation of the functional TMO layer from the silicon substrate. In some embodiments, BTO can be formed on at least a portion of the thick $SiO_2$ layer. In other embodiments, STO can be formed on at least a portion of the thick $SiO_2$ layer.

Some embodiments include a system with a wafer storage unit, a cleaning station, a vacuum deposition growth chamber (e.g., molecular beam epitaxy (MBE) growth chamber), and a furnace. The wafer storage unit can have stored therein an ultra-thin body silicon-on-insulator (SOI) wafer having an ultra-thin device silicon layer on top of a layer of $SiO_2$. The SOI wafer can include an ultra-thin device silicon layer (e.g., less than ten nm thick) on top of a layer of $SiO_2$. The cleaning station can be configured to receive the ultra-thin body SOI wafer and to clean ultra-thin body SOI wafer. The vacuum deposition growth chamber can receive the ultra-thin body SOI wafer from the cleaning station and heat the ultra-thin body SOI wafer. The MBE growth chamber can also grow an epitaxial TMO template directly on the thin device silicon layer of the ultra-thin body SOI wafer creating a heterostructure. The furnace can oxidize the thin device silicon layer underlying the epitaxial TMO template by annealing the sample at an elevated temperature in oxygen resulting in complete post-deposition oxidation of the thin device silicon layer. In some embodiments, the TMO template can include a channel and possibly a layer of BTO or STO is formed within the channel to create a monolithic waveguide.

In some embodiments, a method can include growing (e.g., via molecular-beam epitaxy or other deposition technique) an epitaxial TMO template on a silicon substrate of an ultra-thin body SOI wafer to create a heterostructure. The SOI wafer can include an ultra-thin device silicon layer (e.g., less than 10 nm) on top of a layer of $SiO_2$. The thin device silicon layer underlying the epitaxial TMO template can be oxidized by annealing the sample at an elevated temperature in oxygen resulting in complete post-deposition oxidation of the thin device silicon layer. In some embodiments, the epitaxial TMO template includes STO. In other embodiments, the epitaxial TMO template includes BTO. The epitaxial TMO template can be grown in a pattern, in accordance with various embodiments, to form at least one monolithic strip waveguide. In some embodiments, BTO can be formed on a portion of the epitaxial TMO template. In other embodiments, STO can be formed on a portion of the epitaxial TMO template.

Some embodiments can alternate depositions of functional oxides and crystalline silicon to create a three-dimensional integrated circuit. Examples of the three-dimensional integrated circuit that can be created include, but are not limited to, an integrated photonic circuit, an integrated electronic circuit, an integrated optoelectronic circuit, and/or an integrated magneto-optic circuit.

In some embodiments, the SOI wafer may be submerged in a buffered oxide etch to remove the native oxide resulting in hydrogen termination, which is then heated to a temperature of 600° C. with a chamber pressure less than $5\times10^{-9}$ Torr to desorb the hydrogen termination layer. The method may also include cleaning of the SOI wafer (e.g., ultrasonically in acetone, isopropyl alcohol, and/or deionized water).

In some embodiments, a silicon-on-insulator wafer can be created that includes a silicon substrate, an insulating layer of silicon dioxide formed on the silicon substrate, and a second layer of STO formed on the first layer of silicon dioxide without wafer bonding.

In some embodiments, a silicon-on-insulator wafer can be created that includes a silicon substrate, an insulating layer of silicon dioxide formed on the silicon substrate, and a second layer of BTO formed on the first layer of silicon dioxide without wafer bonding.

While multiple embodiments are disclosed, still other embodiments of the present invention will become apparent to those skilled in the art from the following detailed description, which shows and describes illustrative embodiments of the invention. As will be realized, the invention is capable of modifications in various aspects, all without departing from the scope of the present invention. Accordingly, the drawings and detailed description are to be regarded as illustrative in nature and not restrictive.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Embodiments of the present technology will be described and explained through the use of the accompanying drawings.

Figure 1A:
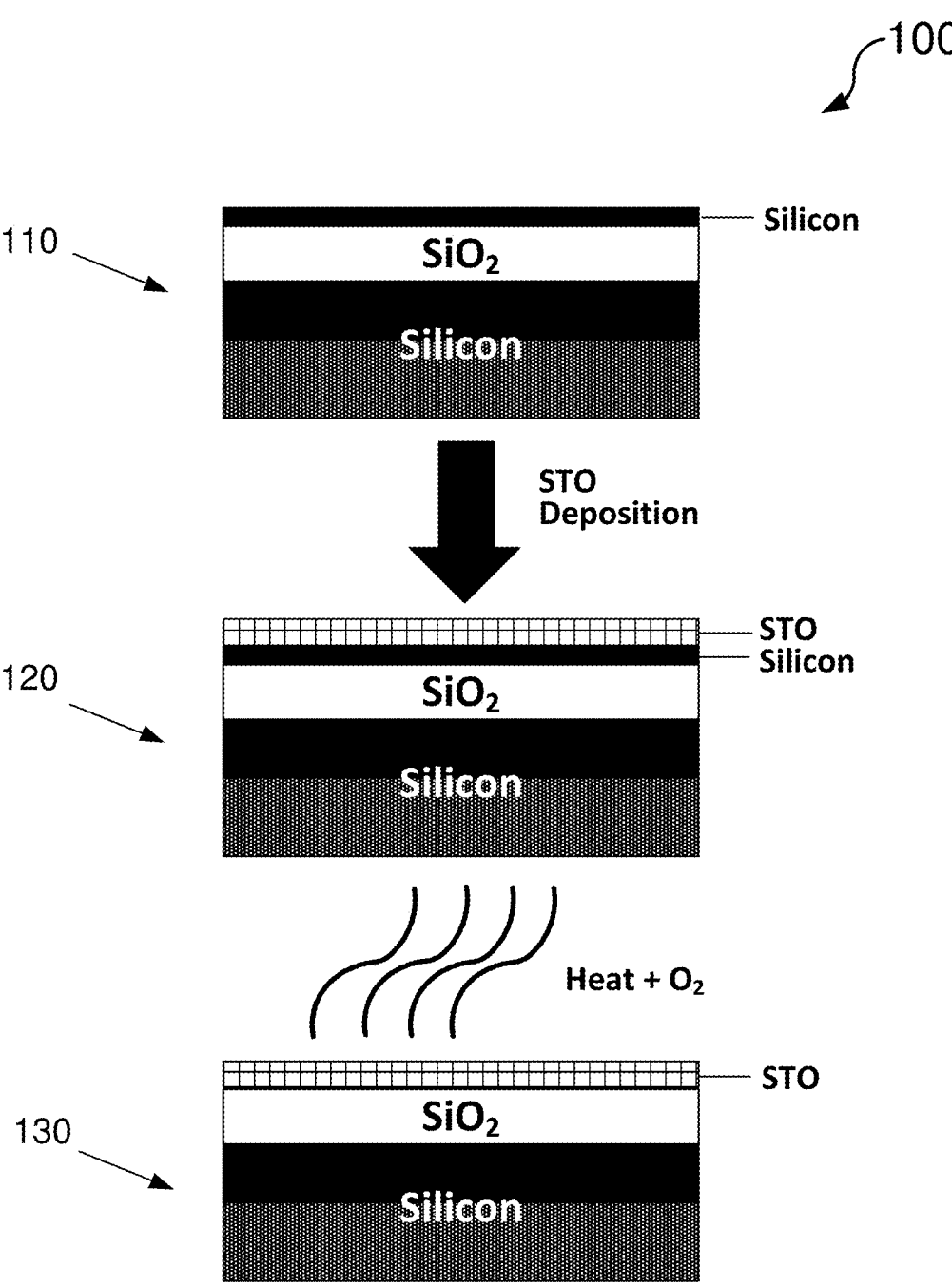
FIGS. 1A and 1B are schematics illustrating an example of a process used for the fabrication of epitaxial TMO thin films on $SiO_2$ in accordance with various embodiments of the present technology.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Various embodiments of the present technology generally relate to the fabrication of epitaxial, thin STO (or BTO) on thick $SiO_2$ without the need for complicated wafer-bonding processes. In some embodiments, the resulting TMO-on-glass layer stack is analogous to traditional SOI wafers, where the crystalline device silicon layer of SOI has been replaced by a crystalline functional TMO layer. In some embodiments, fabrication can start with an SOI body on which crystalline STO (or BTO) is grown epitaxially by molecular beam epitaxy. In other embodiments, the functional TMO layer (STO or BTO) can be grown epitaxially by radio frequency (RF) sputtering. The device silicon layer can be subsequently fully oxidized by ex situ high-temperature dry $O_2$ annealing. Either STO or BTO maintains its epitaxial registry to the carrier silicon substrate after annealing and no evidence for degradation of the STO or BTO crystalline quality as a result of the TMO-on-glass fabrication process is observed. The ease of fabricating the TMO-on-glass platform without the need for wafer bonding will enable rapid progress in the development of state-of-the-art TMO-based electronic and photonic devices.

In the following description, for the purposes of explanation, numerous specific details are set forth in order to provide a thorough understanding of embodiments of the present technology. It will be apparent, however, to one skilled in the art that embodiments of the present technology may be practiced without some of these specific details.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

Figure 1B:
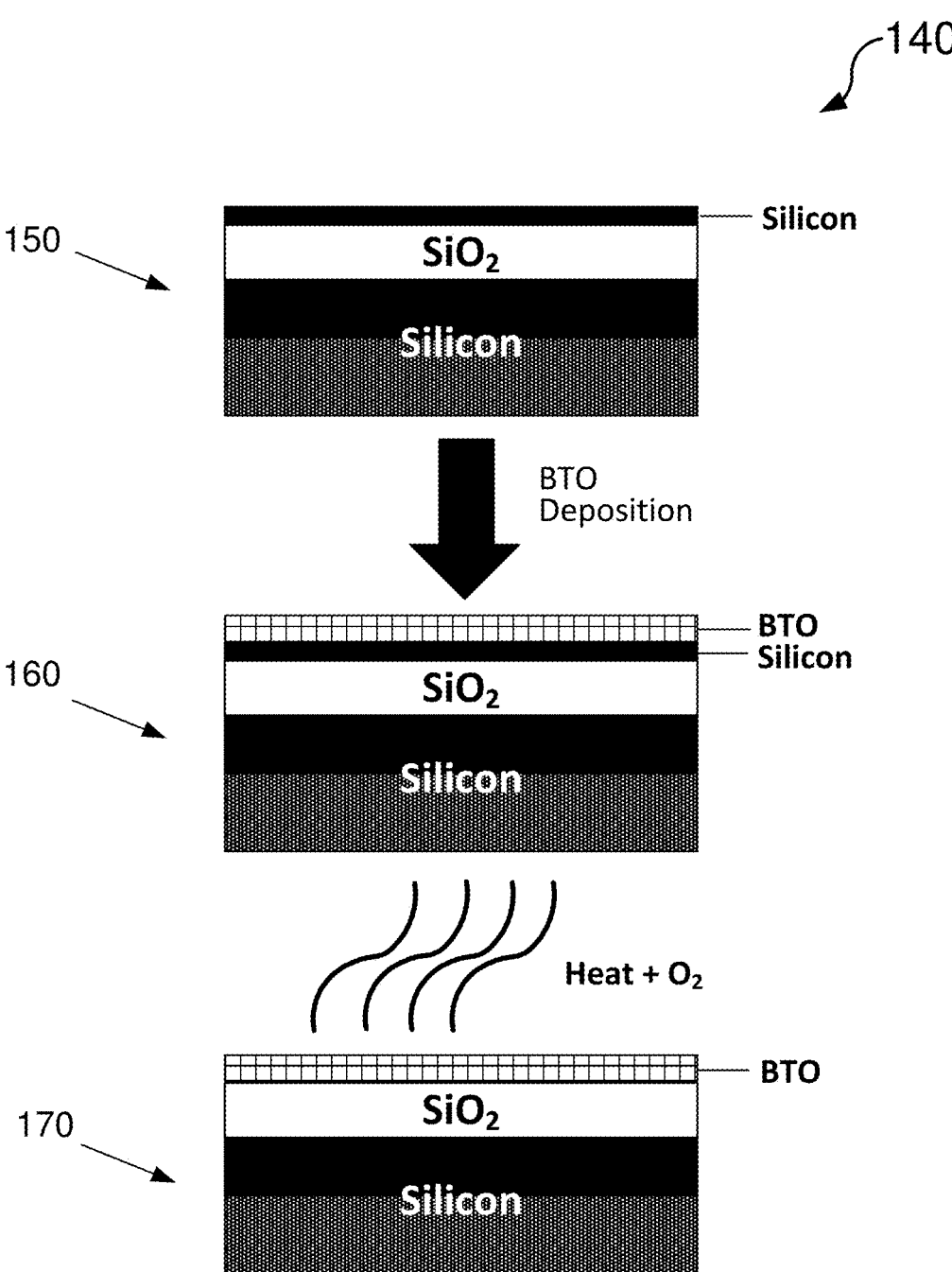
Figure 13:
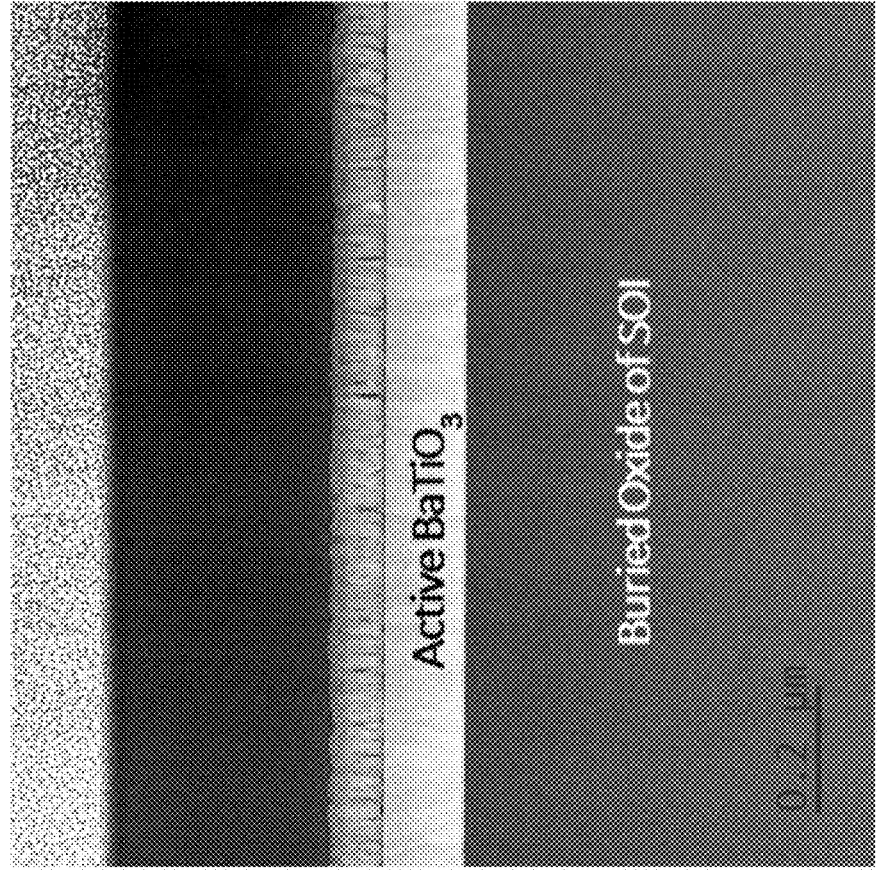
FIG. 13 is a cross-sectional HRTEM image of a device silicon layer atop a buried oxide (BOX) $SiO_2$ layer.

FIGS. 1A and 1B are schematics illustrating an example of processes (e.g., 100 in FIG. 1A and 140 in FIG. 1B) used for the fabrication of epitaxial TMO (STO in FIG. 1A and BTO in FIG. 1B) films on $SiO_2$ in accordance with various embodiments of the present technology. As illustrated in FIGS. 1A, a sample fabrication can begin with an body SOI wafer, 110 (FIG. 1A) or 150 (FIG. 1B). In one example, an ultra-thin body SOI 110, or 150, can be fabricated through a variety of processes, including nanocleaving and Soitec's Smart-Cut® technology, and has already found use in a multitude of devices, including fully-depleted field-effect transistors and photonic sensors. The ultra-thin body SOI wafers 110, or 150, used in some embodiments can feature a 45 Angstrom (Å)-thick device silicon layer atop a 650 Å-thick buried oxide (BOX) $SiO_2$ layer, as shown for example and without limitation in FIG. 13. Additional perovskite oxide films can then be epitaxially deposited on the BTO (or STO) film. The use of the BOX layer in such examples according to the present technology may enable the advantageous avoidance of wafer-bonding being required in the processes disclosed herein, thereby providing substantial efficiency and related gains in practice. In some embodiments of the present technology, the device silicon layer of the SOI may have a thickness of 200 Å or more. In principle, the thickness of the BOX layer could be adjusted to meet the specifications of the intended device structure.

Before deposition, each 20×20 mm² piece of ultra-thin body SOI substrate can be ultrasonically cleaned in acetone, isopropyl alcohol, and deionized water, respectively, for 10 minutes each. After degreasing, the pieces can be submerged in 20:1 buffered oxide etch for a few seconds to remove the native oxide and terminate the surface with hydrogen. The cleaned and etched substrates can then be transferred to vacuum within three minutes of native oxide removal and subsequently introduced to the growth chamber (e.g., an MBE system with a base pressure of $5×10^{-10}$ Torr).

Once loaded into the growth chamber, the substrate can be slowly heated to 600° C. under ultra-high vacuum (UHV) conditions (chamber pressure $<5×10^{-9}$ Torr) to desorb the hydrogen termination layer. Relatively slow heating and cooling rates of 10° C./minute can be used in some embodiments to ensure the device silicon layer is not damaged by thermal stress. Once the substrate temperature is stable at 600° C. (e.g., as measured by a thermocouple), ½ monolayer (ML) of strontium metal can be deposited on the surface to form a Zintl layer for subsequent oxide deposition. After formation of the Zintl layer, as confirmed in situ by the observation of a 2×1 surface reconstruction using reflection high-energy electron diffraction (RHEED), the substrate temperature can be decreased to 200° C. in preparation for either STO or BTO deposition.

When the substrate temperature is stabilized at 200° C., the oxygen valve can be slowly opened. Molecular oxygen can be allowed to flow into the MBE, bringing the chamber pressure to approximately $7×10^{-8}$ Torr. After stabilization of the chamber pressure, strontium and titanium can be co-deposited on the substrate at a rate of approximately 1 ML/min, as measured prior to deposition by a quartz crystal monitor (QCM). Metal deposition can be accomplished by evaporation from effusion cells. Approximately two minutes into the deposition, the oxygen pressure can be steadily increased over a period of three minutes to a final pressure of $5×10^{-7}$ Torr. After five minutes, the oxygen valve can be closed and the deposition halted, resulting in five unit cells (u.c.) of STO on silicon. These aspects of the process according to the present technology may be modified accordingly for co-deposition of barium and titanium on the substrate and rate of change and timing of the oxygen pressure to provide the resulting unit cells of BTO on silicon.

When deposited at such a low temperature, STO and BTO are amorphous as deposited. In the case of STO, subsequent heating to 550° C. in UHV results in the crystallization of the STO film. This can be confirmed by RHEED. After crystallization, each sample can be annealed at 550° C. in UHV for ten minutes before cooling to 200° C. Ten additional u.c. of STO can then deposited on the sample using the same re-crystallization procedure described above, resulting in 15 u.c. of epitaxial STO 120. These aspects of the process may be modified accordingly for crystallization of the BTO film, the annealing, and the deposition of additional BTO on the sample to result in epitaxial BTO 160, as shown in FIG. 1B.

After completion of the STO deposition, the sample can be removed from UHV and annealed in a tube furnace for two hours at 800° C. in the presence of flowing dry $O_2$. The resulting sample features 15 u.c. of epitaxial, crystalline STO on approximately 750 Å of amorphous $SiO_2$ 130. The aspects of the process may be modified accordingly for the tube furnace annealing to result in epitaxial, crystalline BTO on the amorphous $SiO_2$ 170, as shown in FIG. 1B.

Figure 2:
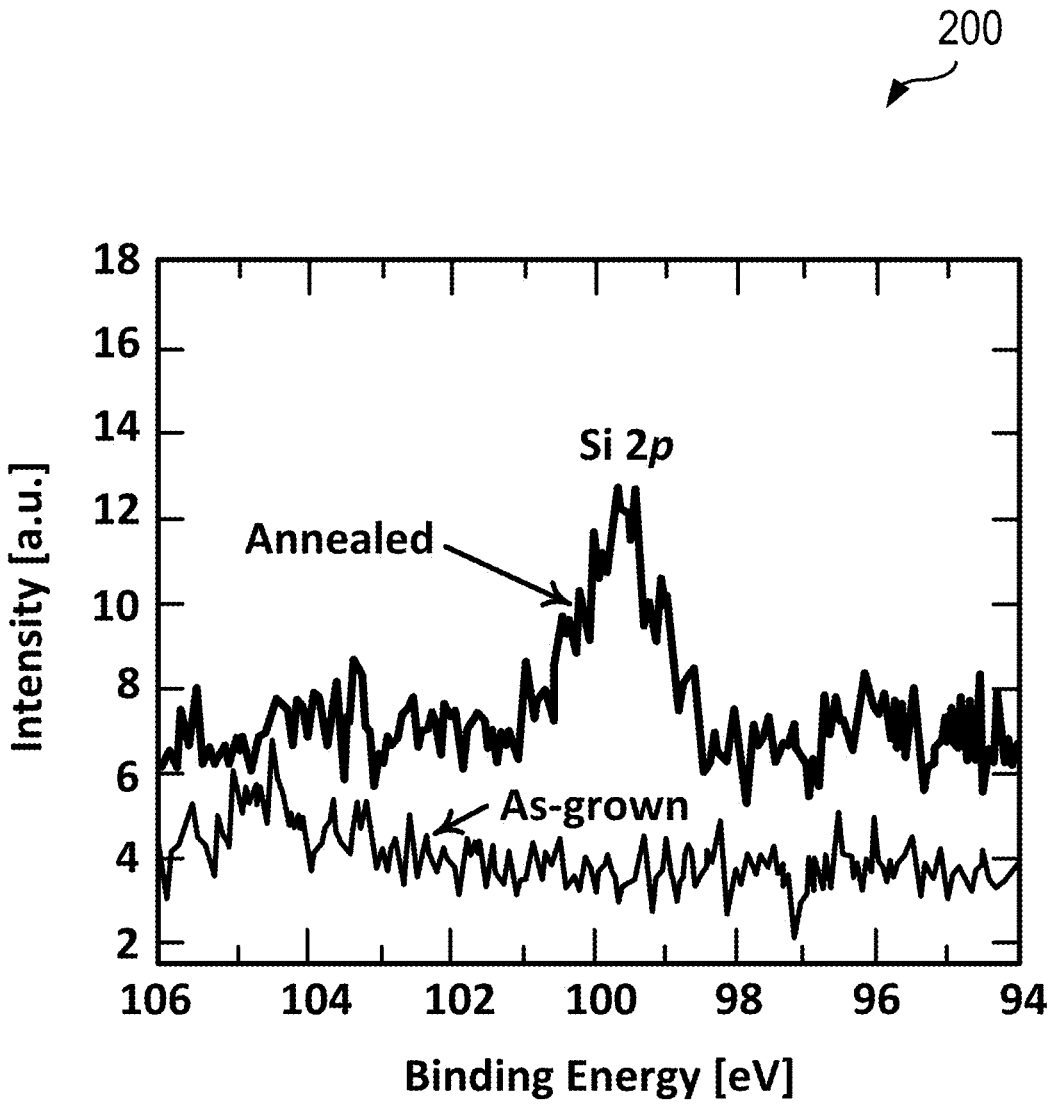
FIG. 2 illustrates X-ray photoelectron spectroscopy (XPS) spectra of as-grown and annealed STO-on-SOI sample around the Si 2p core level.

FIG. 2 illustrates a plot 200 of the XPS spectra of as-grown and annealed STO-on-SOI sample around the Si 2p core level in accordance with one or more embodiments of the present technology. The metallic Si 2p peak disappears after annealing due to oxidation of the device silicon layer. Oxidation of the device silicon layer was confirmed by comparing XPS spectra of the silicon 2p core level before and after annealing in the tube furnace.

The XPS spectra clearly show the disappearance of the metallic silicon 2p peak in the oxidized sample. It should be noted that the spectra in FIG. 2 were taken from the same sample before and after $O_2$ annealing. The relatively weak signal from the silicon core level is due to the limited escape depth of photoelectrons originating from the device silicon layer buried beneath the STO.

While the $O_2$ annealing could reasonably be expected to oxidize the device silicon layer, the survival of the ultra-thin crystalline STO layer is far from guaranteed due to the potential for destructive reactions at the STO/silicon interface. X-ray diffraction (XRD) and reflectivity (XRR) measurements were therefore performed to confirm the persistence of STO crystallinity throughout the fabrication process.

Figure 3:
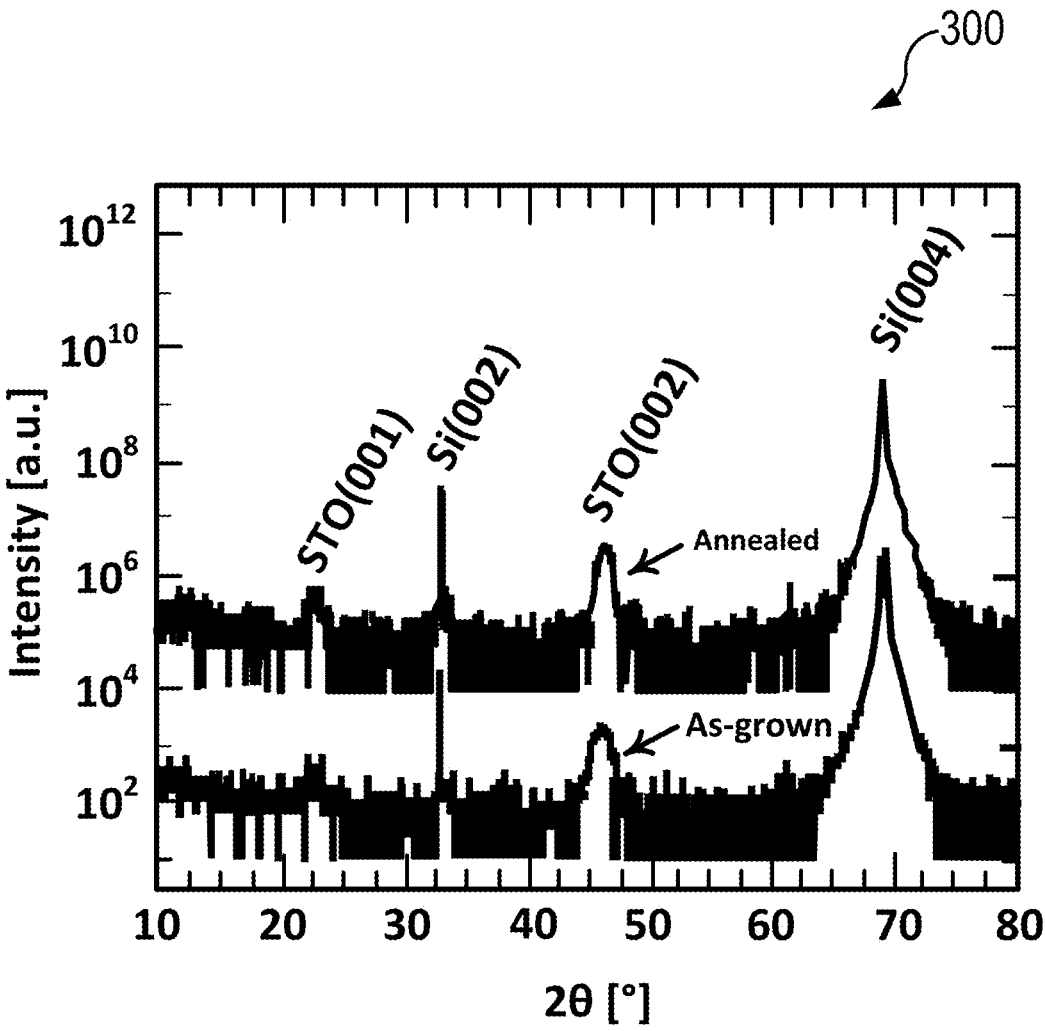
FIG. 3 is a plot of out-of-plane $\theta/2\theta$ XRD measurements of the as-grown and annealed samples.

FIG. 3 is a plot 300 of out-of-plane $\theta/2\theta$ XRD measurements of the as-grown and annealed samples. The spectra are offset for clarity. Only one lattice plane of the STO film is observed, indicating epitaxial registry between the STO film and underlying silicon substrate both before and after oxidation of the device silicon layer. In the out-of-plane $\theta/2\theta$ XRD measurements shown in FIG. 3, the epitaxial relationship between the STO film and the underlying silicon was confirmed in both the as-grown and annealed samples. Only (00/) peaks of the STO film are observed in both spectra, where I is an integer Miller index. The out-of-plane lattice constant of the STO was measured to be approximately 3.94 Å in the as-grown sample and 3.92 Å in the annealed sample, suggesting partial relaxation of the STO lattice constant toward its bulk value from the post-deposition annealing.

Figure 4:
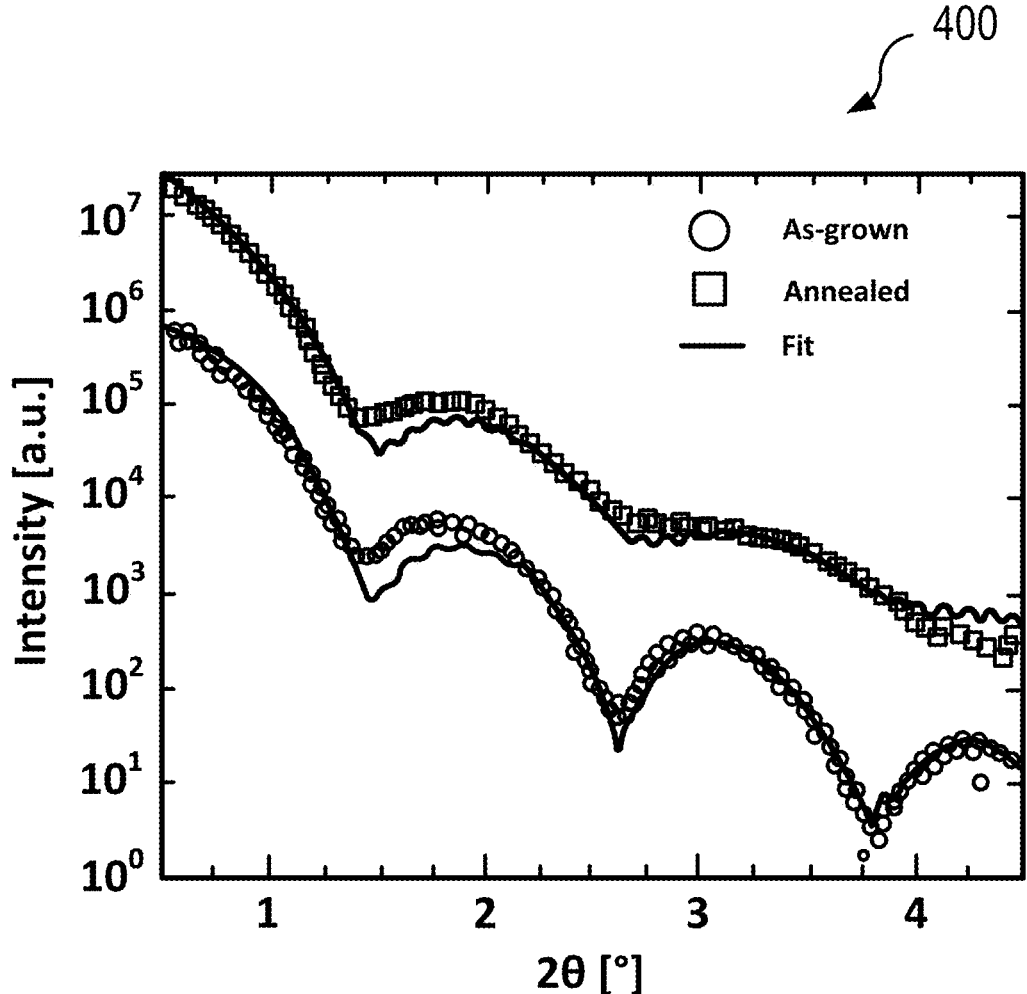
FIG. 4 is a plot of XRR measurements of as-grown (circles) and annealed (squares) samples with a fit (solid lines).

FIG. 4 is a plot 400 of XRR measurements of as-grown (circles) and annealed (squares) samples with a fit (solid lines). The spectra have been offset for clarity. The data are shown as discrete data markers while the fits are shown as solid black lines. The short period oscillations are due to the thickness of the BOX layer. The XRR measurements shown in FIG. 4 further confirm the consistent quality of the STO film before and after oxidation of the device silicon layer. Similar advantageous properties may be achieved in the case of BTO films provided by the present technology.

By modeling the XRR data, the STO thickness was found to be consistent between the samples at approximately 69 Å, within the error of the fitting. The measured thickness is somewhat larger than the nominal thickness of approximately 59 Å, likely due to overestimation of deposition rates from QCM calibration. Additionally, a surface roughness of approximately 4.2 Å was calculated for the as-grown sample while a surface roughness of approximately 3.4 Å was calculated for the annealed sample. The small difference between the two roughness values suggests that oxidation of the device silicon layer did not have a significant impact on the STO surface roughness. Similar advantageous properties may be achieved in the case of BTO films provided by the present technology.

The primary difference between the XRR spectra lies in the decrease of the oscillation amplitude in the annealed sample as compared to the as-grown sample. The decreased amplitude is a result of the smaller density contrast between STO and $SiO_2$ than between STO and silicon. The XRR spectra thus confirm oxidation of the device silicon layer after $O_2$ annealing, consistent with the XPS results (FIG. 2). Similar beneficial results may be expected in the case of BTO films provided by the present technology.

Figure 5A:
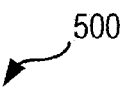
FIGS. 5A and 5B are cross-sectional high-resolution transmission electron microscopy (HRTEM) images of as-grown sample (top) and sample after $O_2$ annealing (bottom) in accordance with various embodiments of the present technology.
Figure 5A:
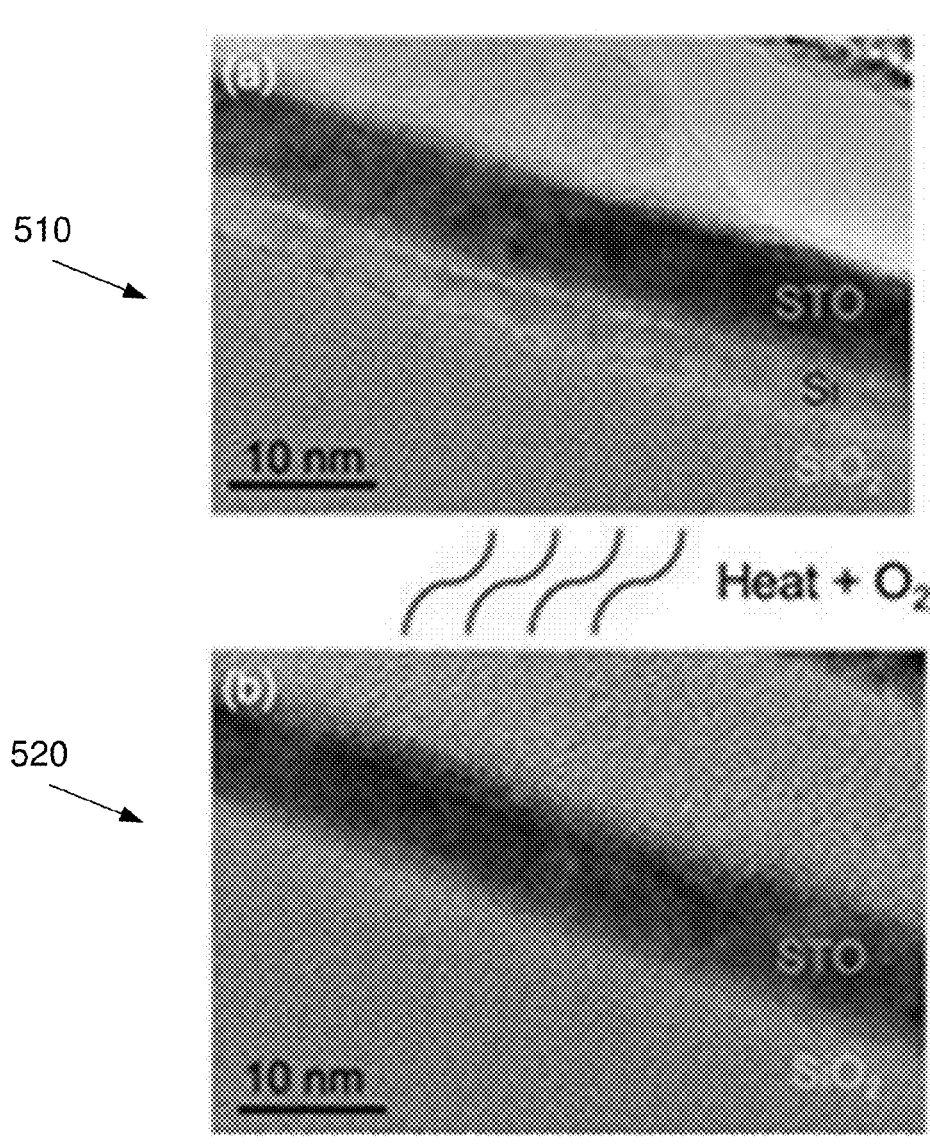
Figure 5B:
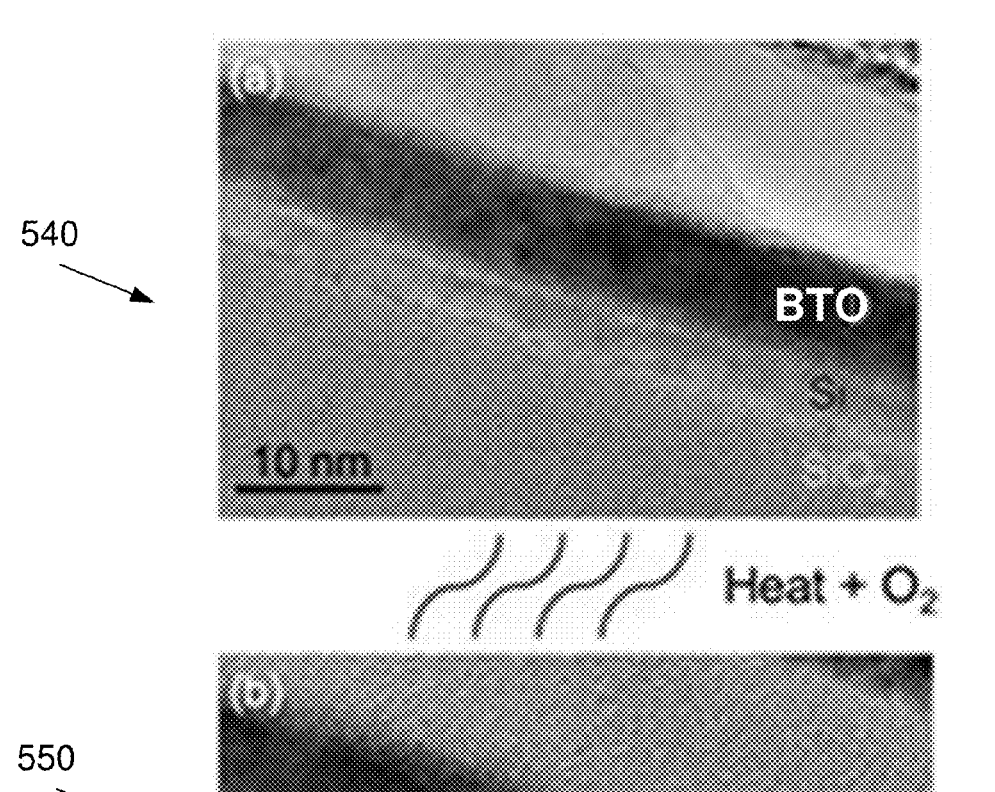

FIGS. 5A and 5B are cross-sectional high-resolution transmission electron microscopy (HRTEM) images (500 of FIG. 5A and 530 of FIG. 5B) of as-grown sample (510 for STO in FIG. 5A and 540 for BTO in FIG. 5B) and sample after $O_2$ annealing (520 for STO in FIG. 5A and 550 for BTO in FIG. 5B), in accordance with various embodiments of the present technology. The HRTEM images confirm complete oxidation of the device silicon layer after $O_2$ annealing. Cross-sectional HRTEM allows for direct observation of the local microstructure of the samples before and after annealing. For the as-grown sample shown in FIG. 1A, for example, HRTEM images confirm the presence of the thin, crystalline device silicon layer on which the STO film is grown 510. A thin amorphous interlayer is also visible between the STO and the device silicon, as commonly observed for STO grown on silicon. In the HRTEM image of the annealed sample 520 shown in FIG. 1A, the device silicon layer is no longer present, in agreement with the XPS and XRR results (FIGS. 2 and 4, respectively). HRTEM measurements thus confirm successful oxidation of the entire device silicon layer by $O_2$ annealing. Furthermore, an STO thickness of approximately 70 Å is measured from the HRTEM images, validating the XRR fitting results (FIG. 4). Similar beneficial results may be expected in the case of BTO films provided by the present technology.

Figure 6A:
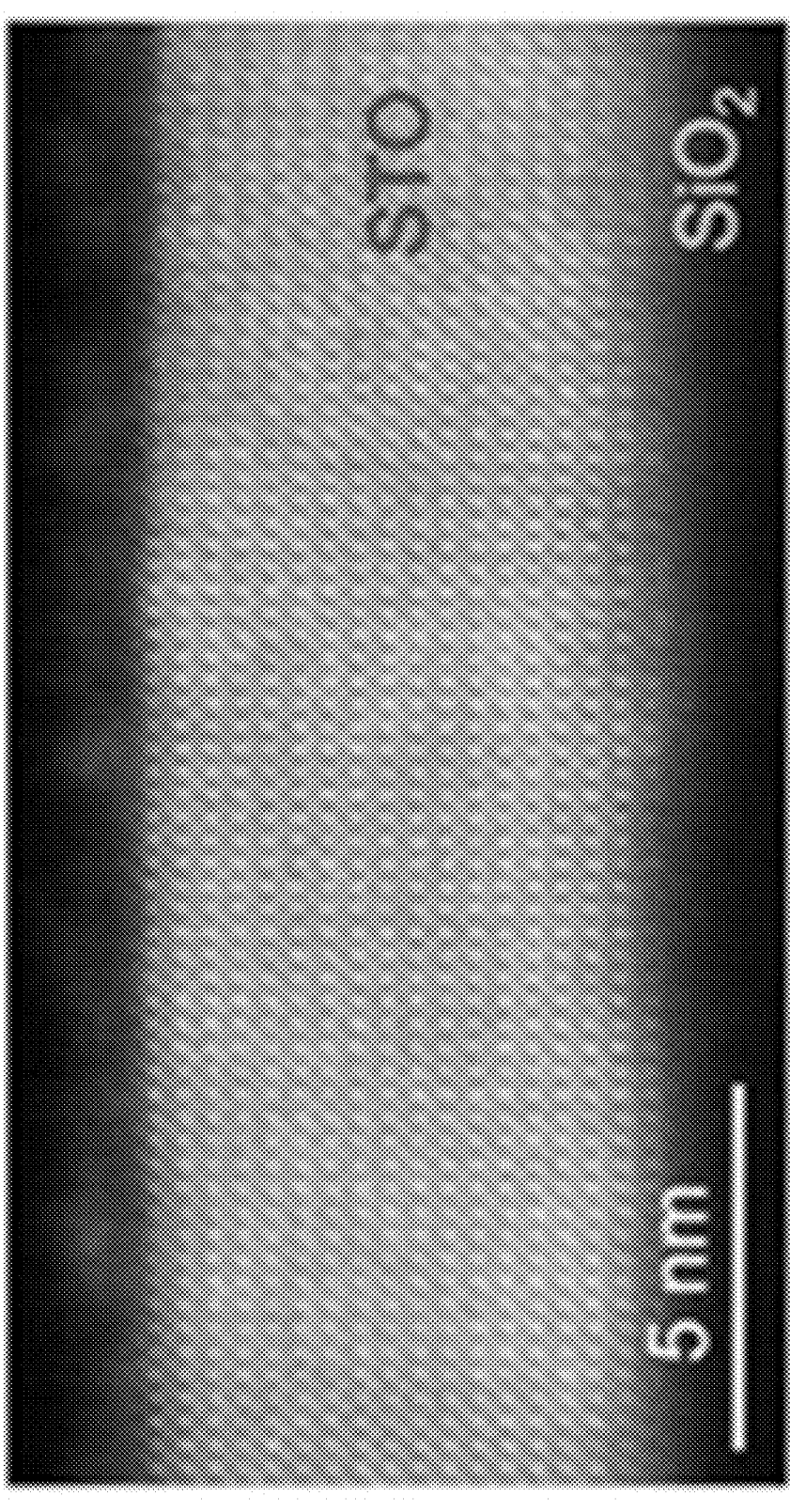
FIGS. 6A and 6B are images taken along the STO [100] and BTO [100] zone axes, respectively, using atomic resolution aberration corrected scanning transmission electron microscopy (AC-STEM) of TMO-on-glass layer stacks captured in annular-dark-field mode, demonstrating the excellent crystalline quality of the epitaxial STO and BTO films and the absence of the device silicon layer.
Figure 6B:
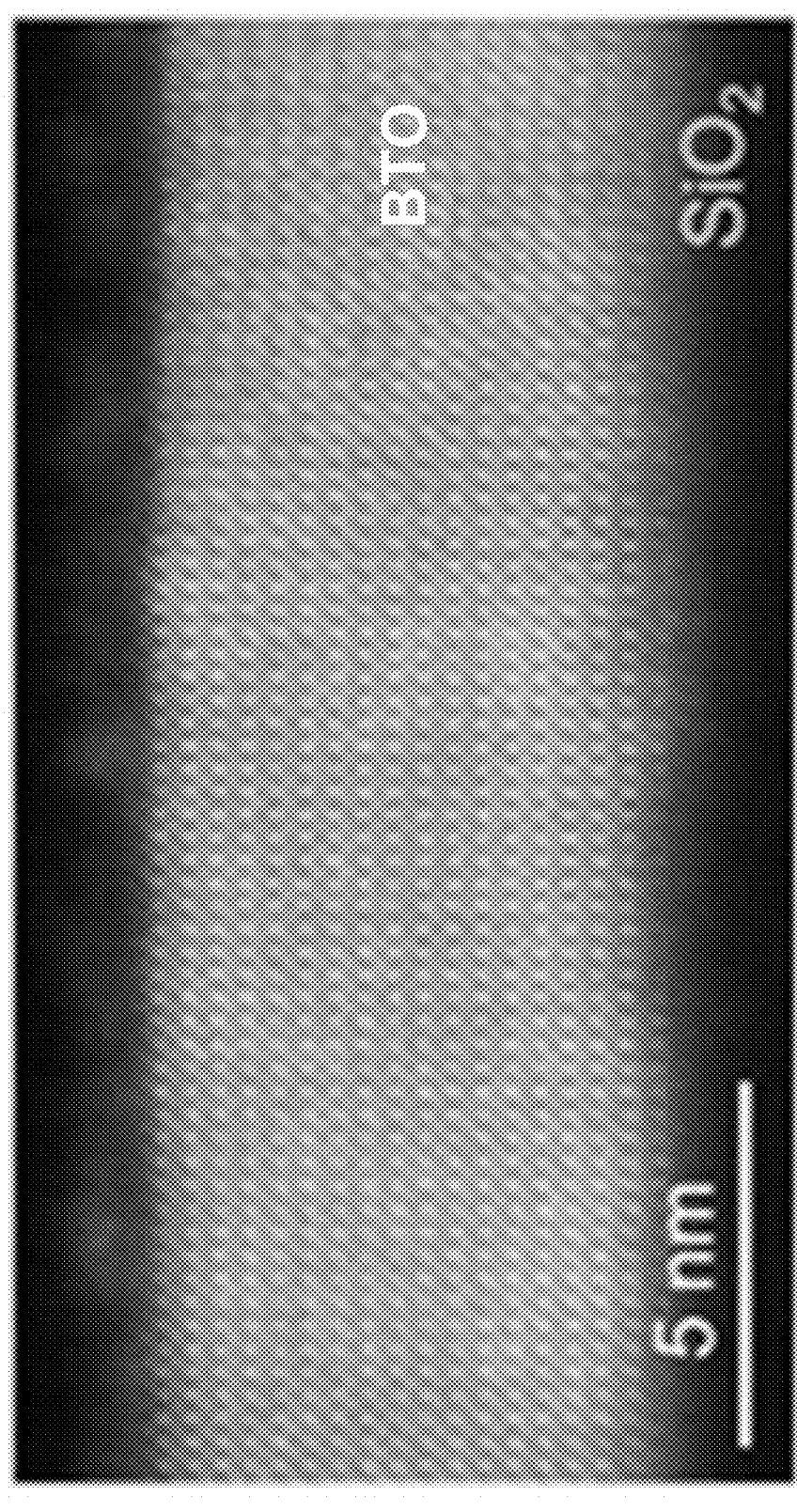

FIGS. 6A and 6B are images taken along the STO [100] (image 600) and BTO [100] (image 602) zone axes, respectively, using atomic resolution aberration corrected scanning transmission electron microscopy (AC-STEM) of TMO-on-glass layer stacks captured in annular-dark-field mode. Images 600 and 602 demonstrate the excellent crystalline quality of the epitaxial, ultra-thin STO and BTO film and the absence of the device silicon layer. As can be seen in FIGS. 6A and 6B, the maintenance of good STO or BTO crystalline quality after the high-temperature $O_2$ annealing has been further confirmed by AC-STEM. No degradation of the STO or BTO crystalline lattice is observed from the AC-STEM images and relatively few defects are apparent across the imaged field-of-view. Furthermore, the interface between the STO (or BTO) film and the $SiO_2$ layer does not indicate the occurrence of chemical reactions between the STO (or BTO) film and the device silicon layer during the high-temperature annealing process. Rather, the entireties of the films survives the TMO-on-glass fabrication process, providing a smooth, highly crystalline template suitable for additional film deposition and device patterning.

A wide range of potential applications for the STO (or BTO)-buffered $SiO_2$ pseudo-substrates demonstrated here can be envisioned, owing in large part to the ease of manufacture. The epitaxial compatibility between STO (or BTO)-buffered $SiO_2$ and a plethora of functional TMO materials will facilitate the fabrication of novel TMO devices on an electrically and optically isolated platform. For example, the use of the TMO-on-glass platform for the construction of planar TMO-based electronic devices will guarantee decoupling of the in-plane electronic response from the buried semiconducting silicon substrate, allowing any measured response to be unambiguously attributed to TMO films and interfaces themselves. Additionally, TMO-based photonic devices can be developed from the TMO-on-glass platform, preventing leakage of the confined optical mode into the silicon substrate. The TMO-on-glass platform described here should open the door for the fabrication and study of many novel TMO devices by allowing greater access to the necessary layer stacks and facilitating the study of the functional oxides themselves, decoupled from the substrate on which they are grown.

Silicon Thermal Oxidation Under STO

Figure 7:
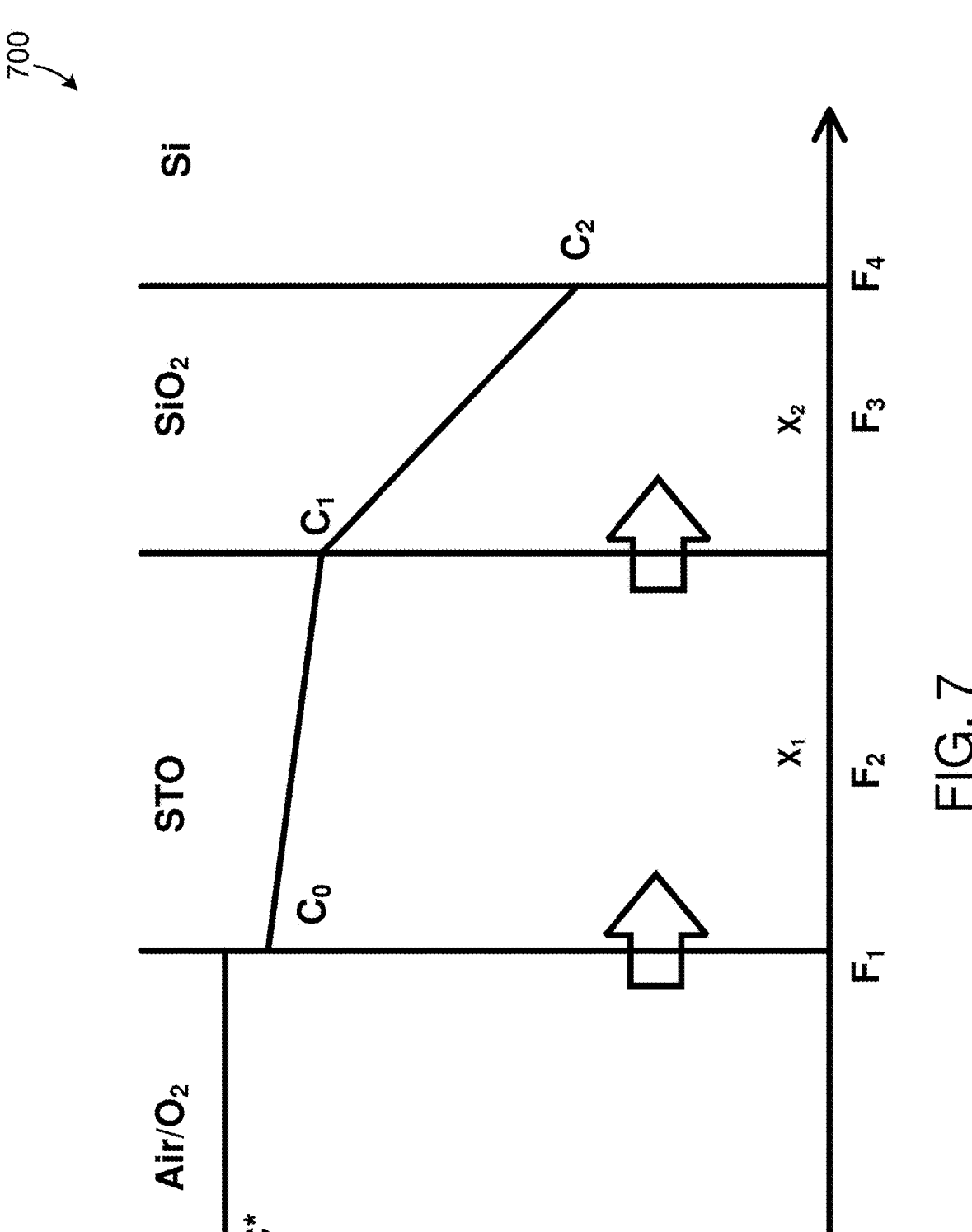
FIG. 7 is the diagram of the diffusion showing how to oxidize the Si under certain thickness of $SrTiO_3$ integrated on Si, and how to get desired thickness of a $SiO_2$ interlayer by thermal oxygen anneal.

Various embodiments allow for the oxidation of the Si under certain thickness of STO (or BTO) integrated on Si. The following discussion provides an example of how to oxidize the Si under certain thickness of STO integrated on Si, and how to get desired thickness of a $SiO_2$ interlayer by thermal oxygen anneal. FIG. 7 is the diagram of the diffusion in STO case according to the present technology. In the following equation, C* is the oxygen concentration of outer atmosphere; Co is oxygen concentration at surface STO; $C_1$ is oxygen concentration at the interface of STO and silica; $C_2$ is the oxygen concentration at $SiO_2$/Si interface; $x_1$ and $x_2$ are the thickness of STO and $SiO_2$; $F_1$ is the flux from the outer space into surface of STO; F2 is the flux in STO, $F_3$ is flux in silica; and $F_4$ is the oxidation rate at the Si interface.

In accordance with various embodiments, the steady-state condition can be used and all the flux can be considered stable.

$$F_1 = h(C^* - C_0).$$

Here, h is the transport coefficient from gas into material.

$$F_2 = -D_1 \frac{dC}{dx}$$

by Fick's Law which states that flux goes from regions of high concentration to regions of low concentration, with a magnitude that is proportional to the concentration gradient (spatial derivative). Stated another way, a solute will move from a region of high concentration to a region of low concentration across a concentration gradient. In the present case, because the flux is linear, $$F_2 = D_1 \frac{(C_0 - C_1)}{x_1},$$

$D_1$ is the diffusivity of oxygen in STO.
For the same form:

$$F_3 = D_2 \frac{(C_1 - C_2)}{x_2}, F_4 = kC_2,$$

where k is the reaction rate of Si.

This is the classic Deal and Grove Si oxidation model. Flux is uniform so:

$$F_1 = F_2 = F_3 F_4$$

Solving this system of equations, one can see that:

$$\frac{C_0}{C^*} = \frac{1 + \frac{kx_1}{D_1} + \frac{kx_2}{D_2}}{1 + \frac{k}{h} + \frac{kx_1}{D_1} + \frac{kx_2}{D_2}},$$

$$\frac{C_1}{C^*} = \frac{1 + \frac{kx_2}{D_2}}{1 + \frac{k}{h} + \frac{kx_1}{D_1} + \frac{kx_2}{D_2}},$$

$$\frac{C_2}{C^*} = \frac{1}{1 + \frac{k}{h} + \frac{kx_1}{D_1} + \frac{kx_2}{D_2}}$$

Figure 8:
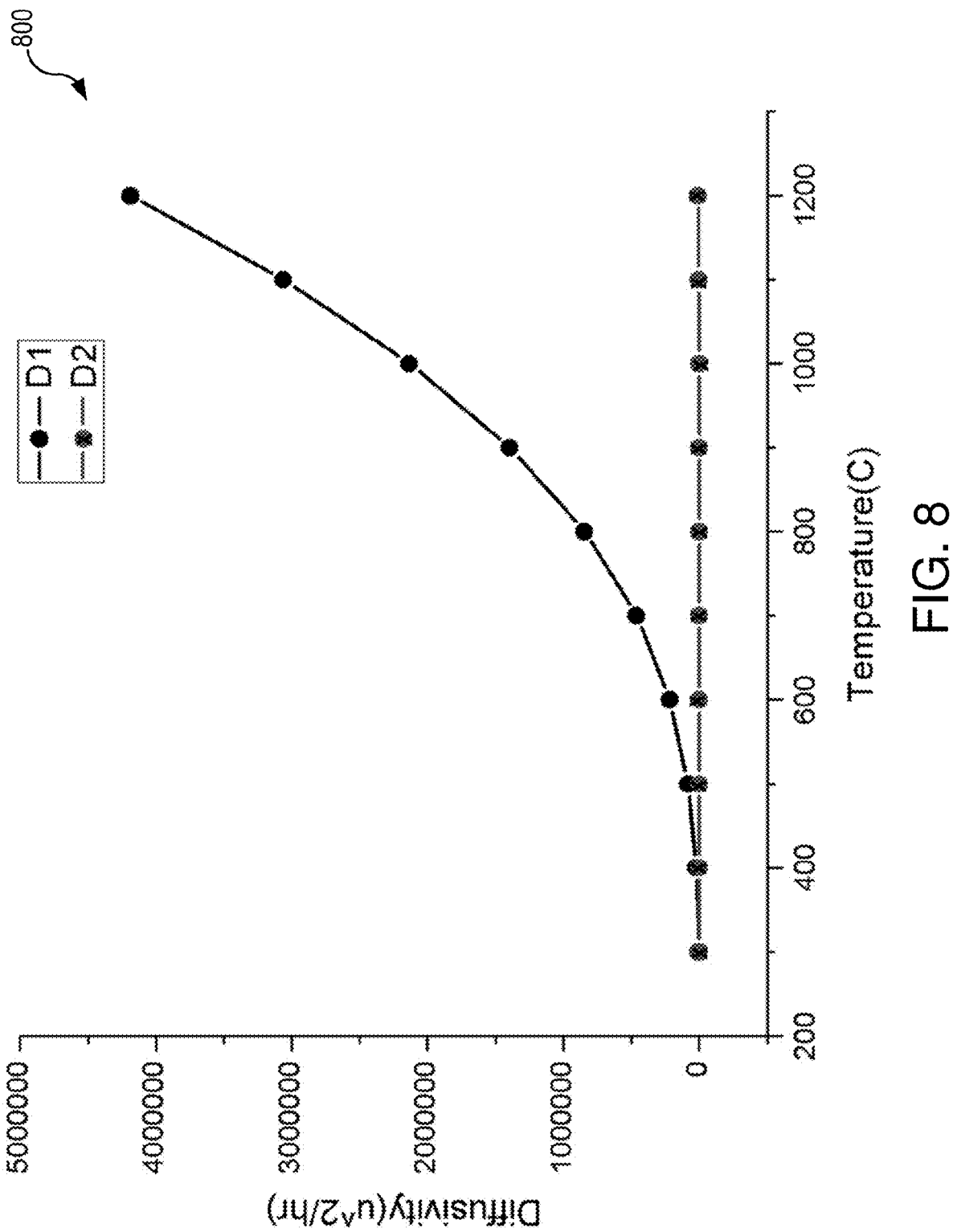
FIG. 8 is a plot comparing the diffusivity of oxygen in STO and in silica.

FIG. 8 is a plot 800 comparing the diffusivity of oxygen in STO and silica.

As can be seen in these plots, through 400° C. to over 1000° C., $D_1$ is always at least $10^3$ times bigger than $D_2$. So $$\frac{kx_1}{D_1}$$

can be neglected in the results.
So:

$$\frac{dx_2}{dt} = \frac{F}{N_1} = \frac{kC^*/N_1}{1 + \frac{k}{h} + \frac{kx_2}{D_2}} = \frac{B}{A + 2x_2}$$

$N_1$ is the oxygen needed to oxidize a unit volume of Si.

$$A = 2D_2\left(\frac{1}{k} + \frac{1}{h}\right), B = 2\frac{C^* D_2}{N_1}$$

After the modification of the Massoud model.

$$\frac{dx_0}{dt} = \frac{B}{A + 2x_0} + C_1 e^{-x_0/L_1} + C_2 e^{-x_0/L_2}$$

where A, B, $C_i$, $L_i$, can be fitted from experimental values and already listed in H. Z. Massoud, J. D. Plummer, and E. A. Irene, J. Electrochem. Soc. 132, 1745 (1985) and H. Z. Massoud, J. D. Plummer, and E. A. Irene, J. Electrochem. Soc. 132, 2693 (1985) both of which are hereby incorporated by reference in their entirety for all purposes.

To understand why the steady-state always works in various embodiments of the present technology, consider there is a sudden change in the concentration in the silica layer. The total time it takes to come back to stable concentration should be the total oxygen needed to come back to original concentration divided by the flux. This may be applicable to both the STO and BTO embodiments described herein according to the present technology.

Assuming the total oxygen needed is the same amount of oxygen in this layer to transfer, the numerator will be $$\frac{1}{2}(C_1 - C_2)x_2, \text{ and } F = D_2 \frac{(C_1 - C_2)}{x_2}$$

here. So, $$\Delta t = \frac{\frac{1}{2}(C_1 - C_2)x_2}{D_2 \frac{(C_1 - C_2)}{x_2}} = \frac{x_2^2}{2D_2}.$$

Here $x_2$ is nm level and D is $\sim 10^8$ nm$^2$/hr level. So, $\Delta t$ will just be $\sim 10^{-8}$ hour. So, the transportation of oxygen can be considered to be built very quickly and steady over all time.

Consider this as a simple Si oxidation, the formula of Massoud's model gives:

$$\frac{dx_0}{dt} = \frac{B}{A + 2x_0} + C_1 e^{-x_0/L_1} + C_2 e^{-x_0/L_2}$$

By comparing with experiment data, the formula can be rewritern as:

$$\frac{dx_0}{dt} = \frac{B + K_1 e^{-t/\tau_1} + K_2 e^{-t/\tau_2}}{A + 2x_0}$$

Here:

$$B = C_B \exp\left(-\frac{E_B}{kT}\right), \frac{B}{A} = C_{B/A} \exp\left(-\frac{E_{B/A}}{kT}\right)$$

$$K_1 = K_1^0 \exp\left(-\frac{E_{K_1}}{kT}\right), K_2 = K_2^0 \exp\left(-\frac{E_{K_2}}{kT}\right)$$

$$\tau_1 = \tau_1^0 \exp\left(\frac{E_{\tau_1}}{kT}\right), \tau_2 = \tau_2^0 \exp\left(\frac{E_{\tau_2}}{kT}\right)$$

| Crystal | | Temperature Range T < 1000° C. | | |
|---|---|---|---|---|
| Orientation | | (100) | (111) | (110) |
| $C_B$ | [nm²/min] | $1.70 \times 10^{11}$ | $1.34 \times 10^9$ | $3.73 \times 10^8$ |
| $E_B$ | [eV] | 2.22 | 1.71 | 1.63 |
| $C_{B/A}$ | [nm/min] | $7.35 \times 10^6$ | $1.32 \times 10^7$ | $4.73 \times 10^8$ |
| $E_{B/A}$ | [eV] | 1.76 | 1.74 | 2.10 |
| $K_1^0$ | [nm²/min] | $2.49 \times 10^{11}$ | $2.70 \times 10^9$ | $4.07 \times 10^8$ |
| $E_{K_1}$ | [eV] | 2.18 | 1.74 | 1.54 |
| $K_2^0$ | [nm²/min] | $3.72 \times 10^{11}$ | $1.33 \times 10^9$ | $1.20 \times 10^8$ |
| $E_{K_2}$ | [eV] | 2.28 | 1.76 | 1.56 |
| $\tau_1^0$ | [min] | $4.14 \times 10^{-6}$ | $1.72 \times 10^{-6}$ | $5.38 \times 10^{-9}$ |
| $E_{\tau_1}$ | [eV] | 1.38 | 1.45 | 2.02 |
| $\tau_1^0$ | [min] | $2.71 \times 10^{-7}$ | $1.50 \times 10^{-7}$ | $1.53 \times 10^{-8}$ |
| $E_{\tau_2}$ | [eV] | 1.88 | 1.90 | 2.12 |

By solving the differential equation, one can see that:

$$x_0 = \sqrt{\left(\frac{A}{2}\right)^2 + Bt + M_1\left[1 - \exp\left(-\frac{t}{\tau_1}\right)\right] + M_2\left[1 - \exp\left(-\frac{t}{\tau_2}\right) + M_0\right]} + \frac{A}{2}$$

$$M_0 = x_i^2 + Ax_i, M_1 = K_1\tau_1, M_2 = K_2\tau_2,$$

where $x_i$ is the initial thickness of $SiO_2$.

Experiment Trial

Figure 9:
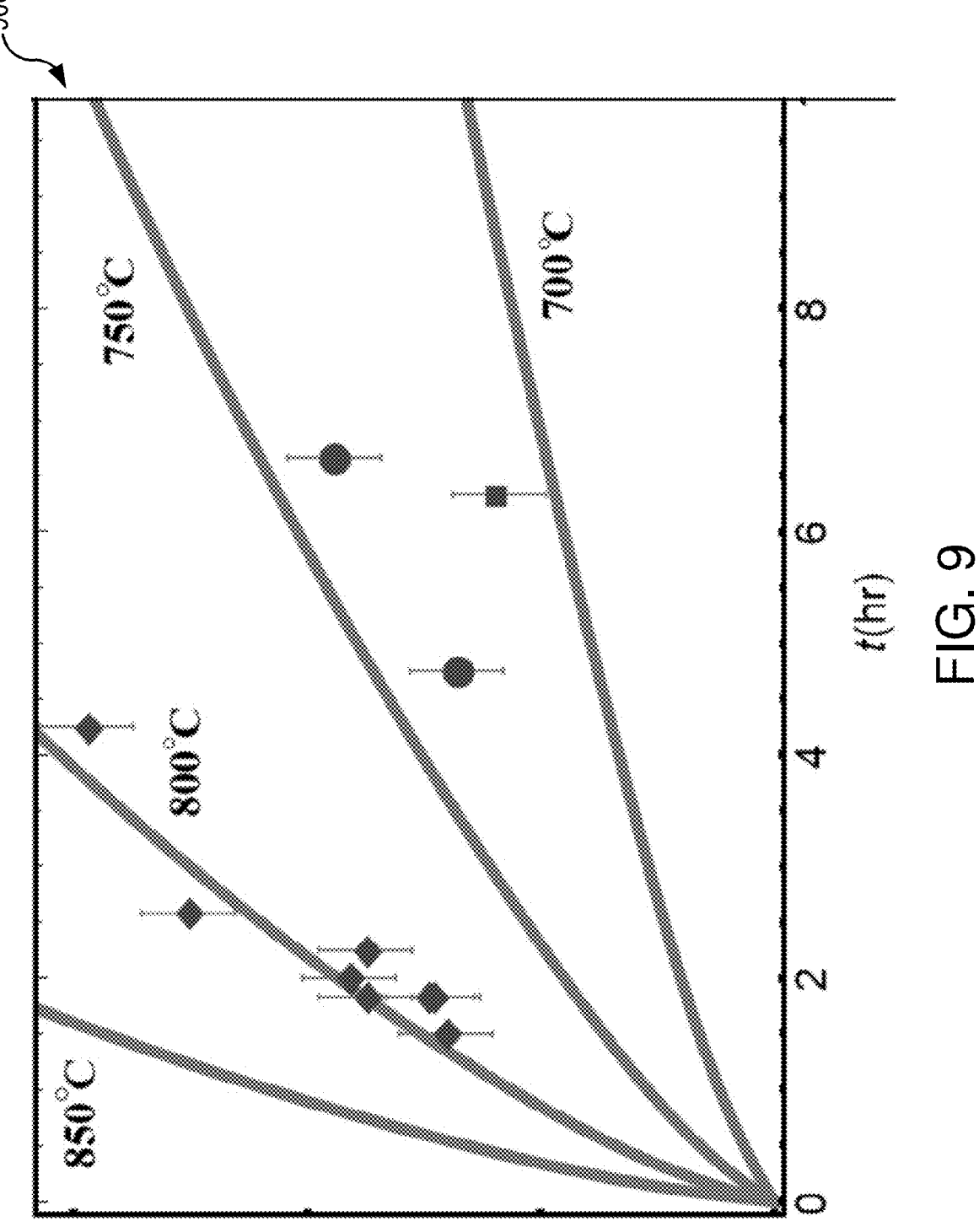
FIG. 9 shows a plot of the expected $SiO_2$ formed from oxygen annealing of a 10 nm-STO layer grown on Si.

The interfacial $SiO_2$ layer will barely build up at low temperature (<6000° C.) Most Si oxidation data are from a range of 800° C.-1300° C. In addition, the STO/Si structure can be degraded at high temperature (1000° C.) as the STO will react with $SiO_2$ and Si. So, the temperature various embodiments may use seek to minimize the degradation of the STO and have an acceptable oxidation rate is ~700-900° C. Similar considerations are expected to be applicable in BTO embodiments according to the present technology. The Deal and Grove model and Massoud model did not consider the out-diffusion of Si through thin $SiO_2$ layer. As a result, the oxidation rate at thin film region (<10nm) is not accurate and needs a fix term. But at this temperature range, the Si emission actually does not play an important role because it is only 4% at 1000° C. For oxidation thickness at different temperatures, FIG. 9 shows a plot 900 of the $x_0$ equation listed above. The curves illustrated in FIG. 9 do not have features that are very exponential in nature. The lines represent the model and the shapes represent the experimental data. Diamonds are samples annealed under 800° C., circles are those under 750° C. and square are for those under 700° C. All have an error bar of 1 nm. The diamond and circle markers are the experiment values from the oxygen furnace annealing. 800° C. was selected as the anneal temperature because the oxidation rate is not too slow and it is not too high to cause interfacial reaction. Similar beneficial results may be expected in the case of the BTO embodiments according to the present technology.

Temperatures higher than 800° C. from 900° C. -1200° C. were tried. In these experiments, the STO cannot survive at those temperature and will break up. So, 800° C. is a safe temperature to do the Si oxidation without degrading the crystallinity of STO on top. To get ~30 nm of $SiO_2$ layer underneath STO, 10 h of 800° C. anneal is required. Similar considerations particular for BTO embodiments are expected to be applicable according to the present technology.

BTO Strip Waveguides on Silicon Dioxide on Silicon

Various embodiments of the present technology provide for a design and potential process for the fabrication of strip waveguides made from the electro-optically active, ferroelectric material BTO. The waveguide design in various embodiments is integrated on silicon substrates, increasing its technological relevance significantly as compared to un-integrable designs.

BTO has found increased use in optical applications in recent years due to its strong linear electro-optic coefficients (Pockels coefficients). For example, BTO has shown promise as a useful material for the construction of high-speed electro-optic modulators and switches in photonic integrated circuits. However, etching BTO is difficult without damaging it. As such, attempts to integrate BTO into waveguide technologies have relied on hybrid geometries combining BTO with silicon or silicon nitride. Such designs limit the optical power confined within the BTO layer, thereby diminishing the device performance and/or increasing the power consumption of the devices. In contrast, various embodiments of the present technology provide for strip waveguides made entirely from BTO without the need for etching. In some embodiments, the design increases the optical power confinement in BTO significantly compared to hybrid BTO-silicon waveguide designs.

The waveguides created in accordance with various embodiments can be strip waveguides made from BTO. Present technologies rely on hybrid structures combining BTO and silicon or silicon nitride. In such hybrid devices, the optical mode is largely confined in the silicon or silicon nitride layers and only partially leaks into the BTO. However, this is sub-optimal because BTO is the electro-optically active material. Therefore, only light confined in BTO experiences any kind of effect.

In general, traditional electro-optic devices suffer from problems of speed (too slow) and power consumption (too much power). By integrating BTO into electro-optic devices, both problems are solved, as the Pockels effect is a very high-speed effect, and it does not require large power consumption. Various embodiments solve the problem of poor performance in hybrid BTO waveguides by increasing the optical power confinement in the electro-optically active BTO layer. There is no requirement to etch the BTO in various embodiments, as etching induces unacceptably high optical losses in BTO, limiting its utility in photonic integrated circuit applications.

Some embodiments have the advantage of increased efficiency over current hybrid BTO technologies. By producing a BTO-only waveguide, BTO-based electro-optic devices can be made more efficient.

Various embodiments of the fabrication process can rely on first growing an epitaxial STO template on silicon and then oxidizing the underlying silicon through the STO by annealing the sample at high temperature in oxygen. Our studies indicate the thickness of silicon that can be oxidized through STO while still maintaining high-quality STO. Therefore, various embodiments of the present technology use a silicon-on-insulator (SOI) substrate with a device silicon layer for deposition. In some embodiments, the device silicon layer of the SOI substrate may be from 45 Å to less than 200 Å. In other embodiments, the device silicon layer of the SOI substrate may be greater than or equal to 200 Å. This is not a disadvantage but does limit the substrates on which various embodiments of the process can work. Some embodiments of the waveguides could find use in a wide range of photonic integrated devices, including modulators, switches, interferometers, and filters. Such devices are utilized in a large number of fields, including communications technologies and transceivers, neuromorphic computing, next-generation sensors and quantum computation.

Figure 10:
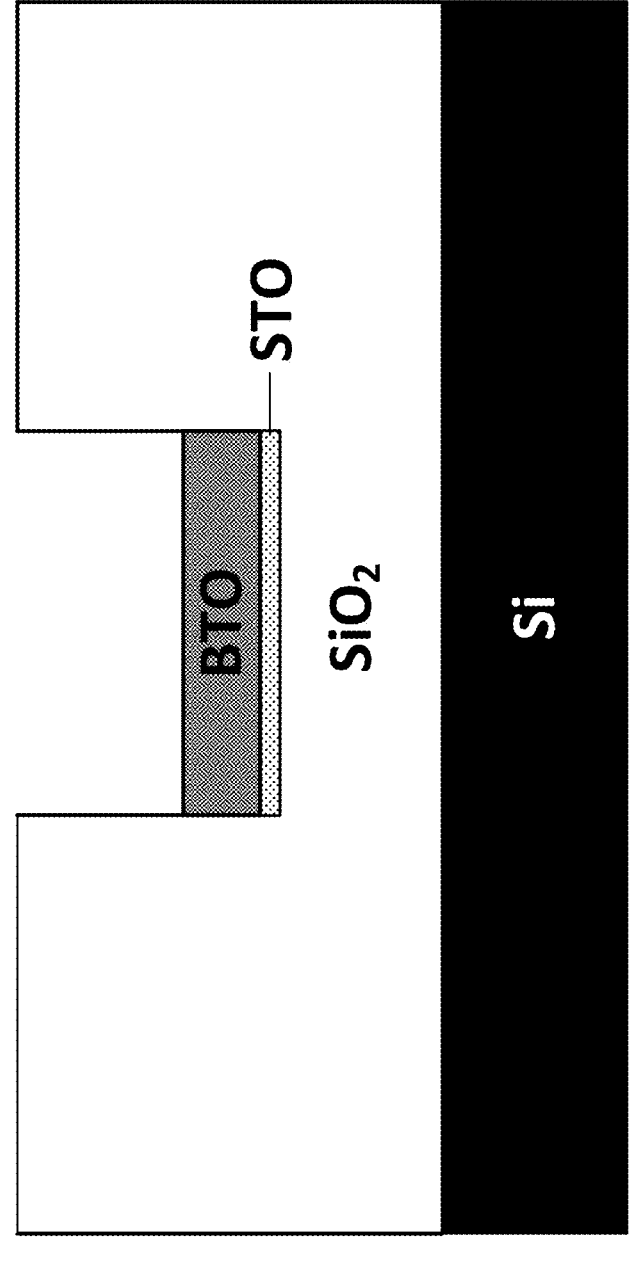
FIG. 10 is a diagram illustrating a waveguide that could be created in accordance with various embodiments of the present technology.
Figure 11A:
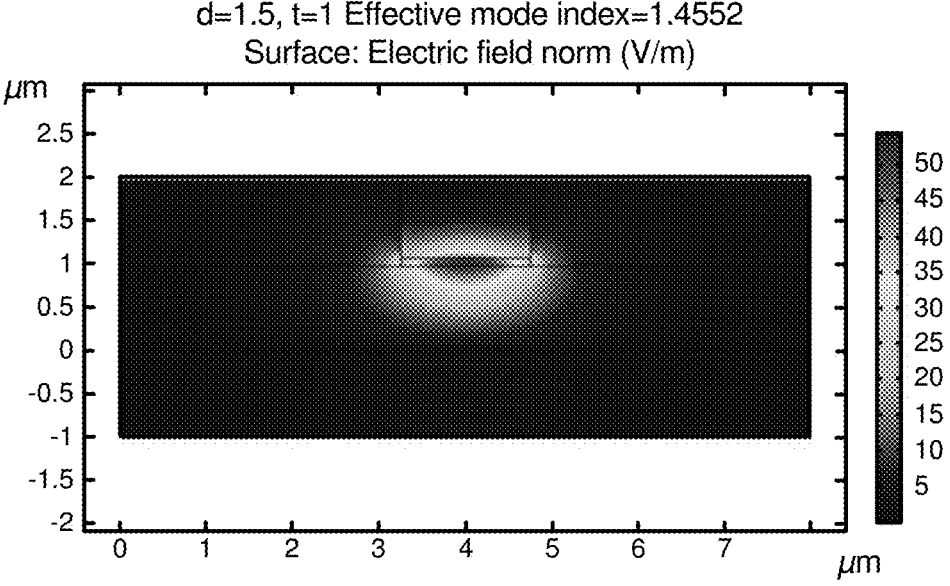
FIGS. 11A and 11B show the simulation results illustrating the first guided modes found for d=1.5 μm for the geometry of the wave guide illustrated in FIG. 10.

Simulations were performed with the BTO width varied from 0.5-6.0 μm. The bottom $SiO_2$ thickness varied from 0.5-2.0 μm with the materials as illustrated in FIG. 10. The BTO thickness was kept constant at 100 nm for most simulations and the Si thickness kept constant at 1 μm. In addition, the top $SiO_2$ thickness was kept constant at 1 μm while the bottom $SiO_2$ thickness t and BTO waveguide width d were varied in steps of 0.5 μm. From these simulations, a suggested set of optimal parameters and design principles were formed. The fundamental mode of a wave guide with width of 1.5 μm is shown in FIG. 11A.

Figure 11B:
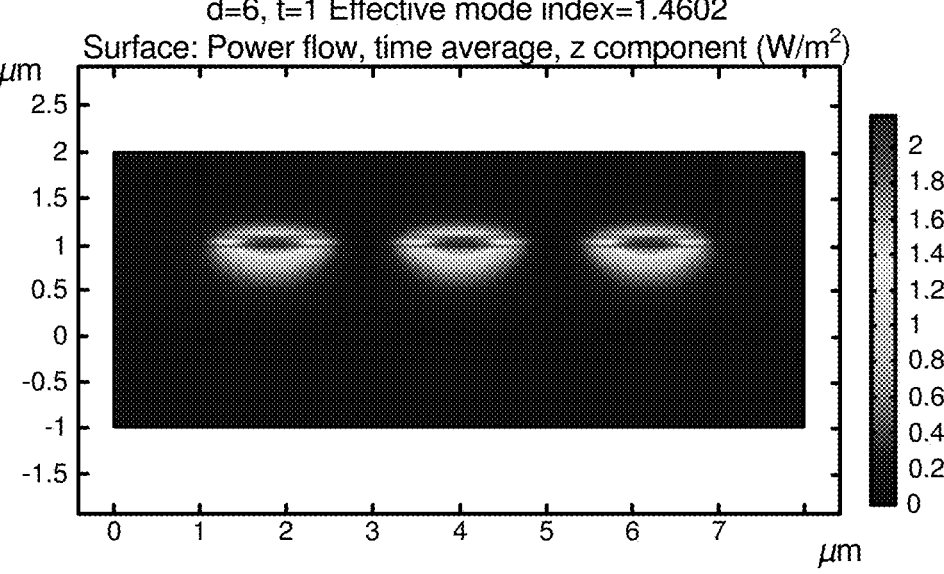

First, the thicker bottom $SiO_2$ leads to better confinement in BTO (improved device performance). The BTO waveguide width between 1.2 and 2.5 μm seems optimal. Simulations with finer BTO width steps indicate guided modes appear beginning at t=1.2 μm. Widths less than 1.0 μm do not support guided modes. Widths greater than 2.5 μm more easily support multiple modes (not just fundamental mode) as shown in FIG. 11B. Depending on the application the presence of the multiple modes may or may not be desirable.

Figure 12:
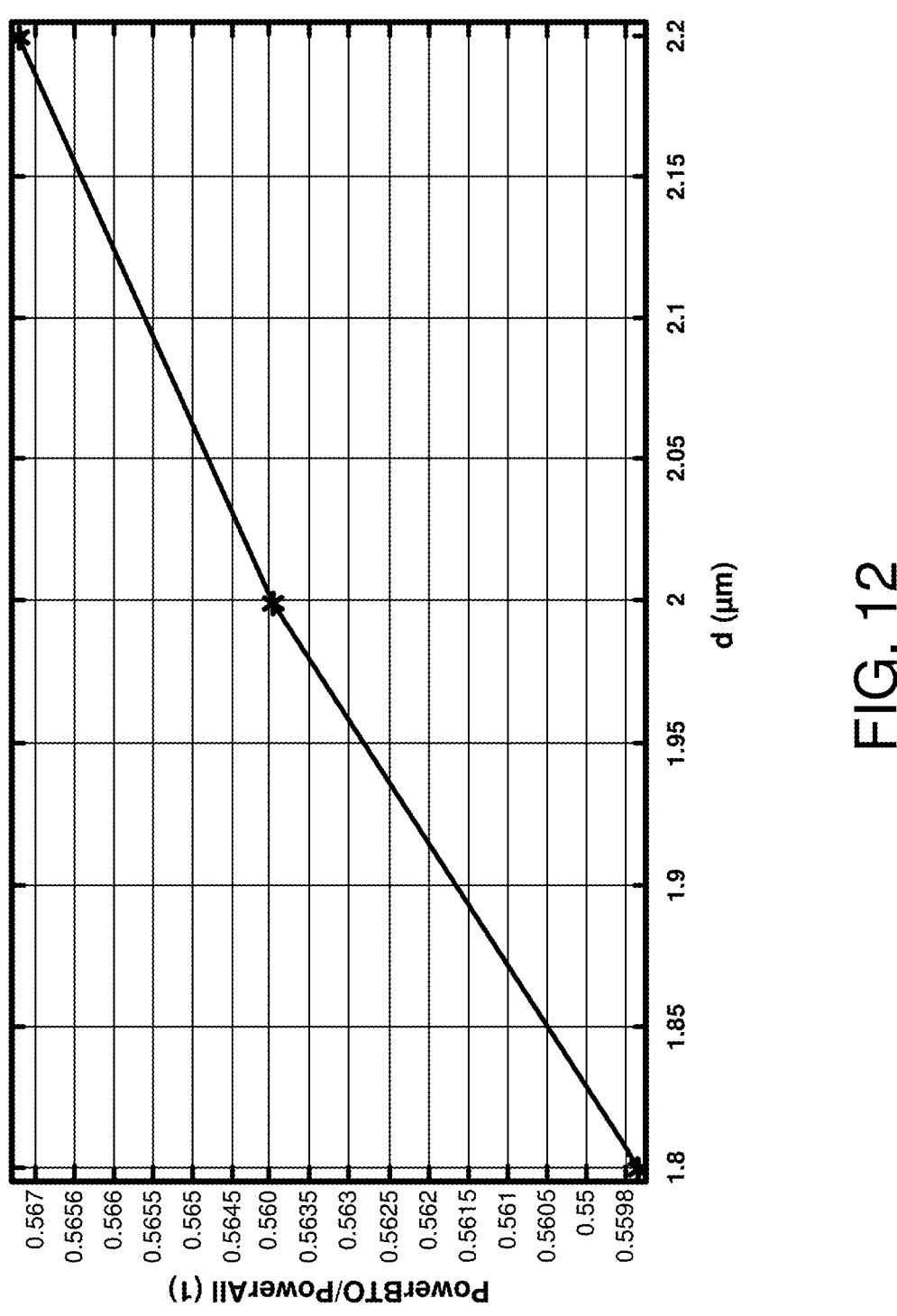
FIG. 12 shows the simulation results identifying three guided modes found for d=6.0 μm for the geometry of the waveguide illustrated in FIG. 10.

Of course, the thicker the BTO, the more light is confined in the BTO. FIGS. 11A-11B shows the simulation results illustrating the first guided modes found for d=1.5 μm for the geometry of the wave guide illustrated in FIG. 10. FIG. 12 shows the simulation results identifying three guided modes found for d=6.0 μm for the geometry of the waveguide illustrated in FIG. 10.

For these simulations, COMSOL solves for the electric field in the xy-plane of the waveguide. The wave is assumed to propagate in the z direction (out of the screen) and the electric field is given by $$\vec{E}(x, y, z, t) = \vec{E}(x, y)e^{i(\omega t - \beta z)}$$

The eigenvalue equation from Helmholtz equation is $$\nabla \times (\nabla \times \vec{E}) - k_0^2 n^2 \vec{E} = 0$$

which is solved for eigenvalues $$\lambda^2 = -\beta^2$$

Eigenvalues are values of β for which $$\vec{E} \neq 0$$

Effective mode index of a confined mode is given by $$n_{eff} = \frac{\beta}{k_0}.$$

Subject to the boundary condition:

$$\vec{E} = 0$$

along the boundary of simulation. Because the modes confined in BTO (center of the simulation cell) were of interest in these simulations, this is a reasonable boundary condition.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology is recited in a particular claim format, other aspects may likewise be embodied as in other forms, such as being embodied in a means-plus-function claim, system, composition of matter, or the like. Any claims intended to be treated under 35 U.S.C. §112(f) will begin with the words "means for", but use of the term "for" in any other context is not intended to invoke treatment under 35 U.S.C. §112(f). Accordingly, the applicant reserves the right to pursue additional claims after filing this application to pursue such additional claim forms, in either this application or in a continuing application.

What is claimed is:

1. A wafer comprising:
a silicon substrate;
a silicon dioxide ($SiO_2$) layer formed on the silicon substrate;
a crystalline functional transition metal oxide (TMO) layer created directly on the $SiO_2$ layer in the absence of wafer bonding; and
alternating layers of functional oxides and crystalline silicon to create a three-dimensional integrated circuit.

2. The wafer of claim 1, wherein the functional TMO layer is epitaxially grown via direct deposition process in a pattern that includes a channel.

3. The wafer of claim 2, wherein the functional TMO layer includes:
strontium titanate; and
a layer of barium titanate formed within the channel to create a monolithic waveguide.

4. The wafer of claim 1, wherein a layer of barium titanate is formed on at least a portion of the functional TMO layer.

5. The wafer of claim 1, wherein the crystalline functional TMO layer includes at least one of: barium titanate and strontium titanate.

6. The wafer of claim 1, wherein the wafer further comprises a device silicon layer formed on the silicon dioxide layer, wherein the device silicon layer comprises a thickness of greater than or equal to 200 angstrom (Å).

7. The wafer of claim 1, wherein the wafer further comprises a device silicon layer formed on the silicon dioxide layer, wherein the device silicon layer comprises a thickness of from 45 Å to less than 200 Å.

8. A silicon-on-insulator wafer comprising:
a silicon substrate;
an insulating layer of silicon dioxide formed on the silicon substrate;
a device silicon layer formed on the insulating layer of silicon dioxide, the device silicon layer having a thickness less than 200 Å; and
a layer of a transition metal oxide (TMO) including at least one of strontium titanate and barium titanate, wherein the layer of TMO is formed directly on the insulating layer of silicon dioxide in the absence of wafer bonding.

9. The wafer of claim 8, wherein the layer of TMO includes strontium titanate.

10. The wafer of claim 8, wherein the layer of TMO includes barium titanate.

11. The wafer of claim 8, wherein a layer of barium titanate is formed within a patterned region of the layer of TMO to define a monolithic waveguide.

12. The wafer of claim 8, wherein the layer of TMO is epitaxially grown via a direct deposition process in a pattern that includes a channel.

13. The wafer of claim 8, wherein the device silicon layer has a thickness of less than 10 nanometers.

14. A wafer comprising:
a silicon substrate;
a device silicon layer;
a silicon dioxide layer formed on the device silicon layer, wherein the device silicon layer has a thickness of from 45 Å to less than 200 Å; and
a crystalline functional transition metal oxide (TMO) layer created directly on the $SiO_2$ layer in the absence of wafer bonding.

15. The wafer of claim 14, wherein the crystalline functional TMO layer is epitaxially grown via direct deposition process in a pattern that includes a channel.

16. The wafer of claim 14, wherein the crystalline functional TMO layer includes:
strontium titanate; and
a layer of barium titanate formed within the channel to create a monolithic waveguide.

17. The wafer of claim 14, wherein a layer of barium titanate is formed on at least a portion of the crystalline functional TMO layer.

18. The wafer of claim 14, further comprising alternating layers of functional oxides and crystalline silicon to create a three-dimensional integrated circuit.

19. The wafer of claim 14, wherein the crystalline functional TMO layer includes at least one of: barium titanate and strontium titanate.

* * * * *